United States Patent [19]
Kiyota

[11] Patent Number: 5,959,920
[45] Date of Patent: Sep. 28, 1999

[54] SEMICONDUCTOR MEMORY DEVICE USING SENSE AMPLIFIERS IN A DUMMY CELL AREA FOR INCREASING WRITING SPEED

[75] Inventor: Yukiyoshi Kiyota, Kanagawa, Japan

[73] Assignee: NEC Corporation, Tokyo, Japan

[21] Appl. No.: 09/098,339

[22] Filed: Jun. 17, 1998

[30] Foreign Application Priority Data

Jun. 18, 1997 [JP] Japan .................................. 9-160705

[51] Int. Cl.⁶ .................................................. G11C 7/00
[52] U.S. Cl. ........................... 365/207; 365/205; 365/210
[58] Field of Search .......................... 365/63, 51, 189.01, 365/205, 207, 208

[56] References Cited

U.S. PATENT DOCUMENTS 5,841,688  11/1998  Sukegawa et al. ....................... 365/63
5,864,496  1/1999   Mueller et al. .......................... 365/69

FOREIGN PATENT DOCUMENTS

5-41083  2/1993  Japan .

*Primary Examiner*—Vu A. Le
*Attorney, Agent, or Firm*—McGinn & Gibb, P.C.

[57] ABSTRACT

A semiconductor memory device comprises memory cells at least one pair of bit lines; word lines for taking out information from the memory cells into the pair of bit lines; sense amplifiers for detecting potential difference between the pair of the bit lines and amplifying it to a predetermined level; a write amplifier into which write data from outside are inputted and which drives the pair of data path lines for complementary data; inputting means and for providing the pair of data path lines to the respective pair of bit lines; and one or more amplifying means and for detecting potential difference between the pair of data path lines and amplifying it to a predetermined level. The sense amplifier in a sense amplifier area corresponding to the dummy cell area for treating the end portion of the memory cell array area and a word line-suspending section is used to drive the pair of data path lines in the middle of the wiring of the pair of data path lines, thereby carrying out high speed writing. Thus, it is possible to make writing speedier and reduce voltage used without making the size of the write amplifier large.

20 Claims, 5 Drawing Sheets

SEMICONDUCTOR MEMORY DEVICE USING SENSE AMPLIFIERS IN A DUMMY CELL AREA FOR INCREASING WRITING SPEED

BACKGROUND OF THE INVENTION

1. Field of the Invention

The present invention relates to a semiconductor memory device, and in particular to a semiconductor memory device which can make writing more speedy; and a layout structure thereof.

2. Description of the Related Art

Figure 1:
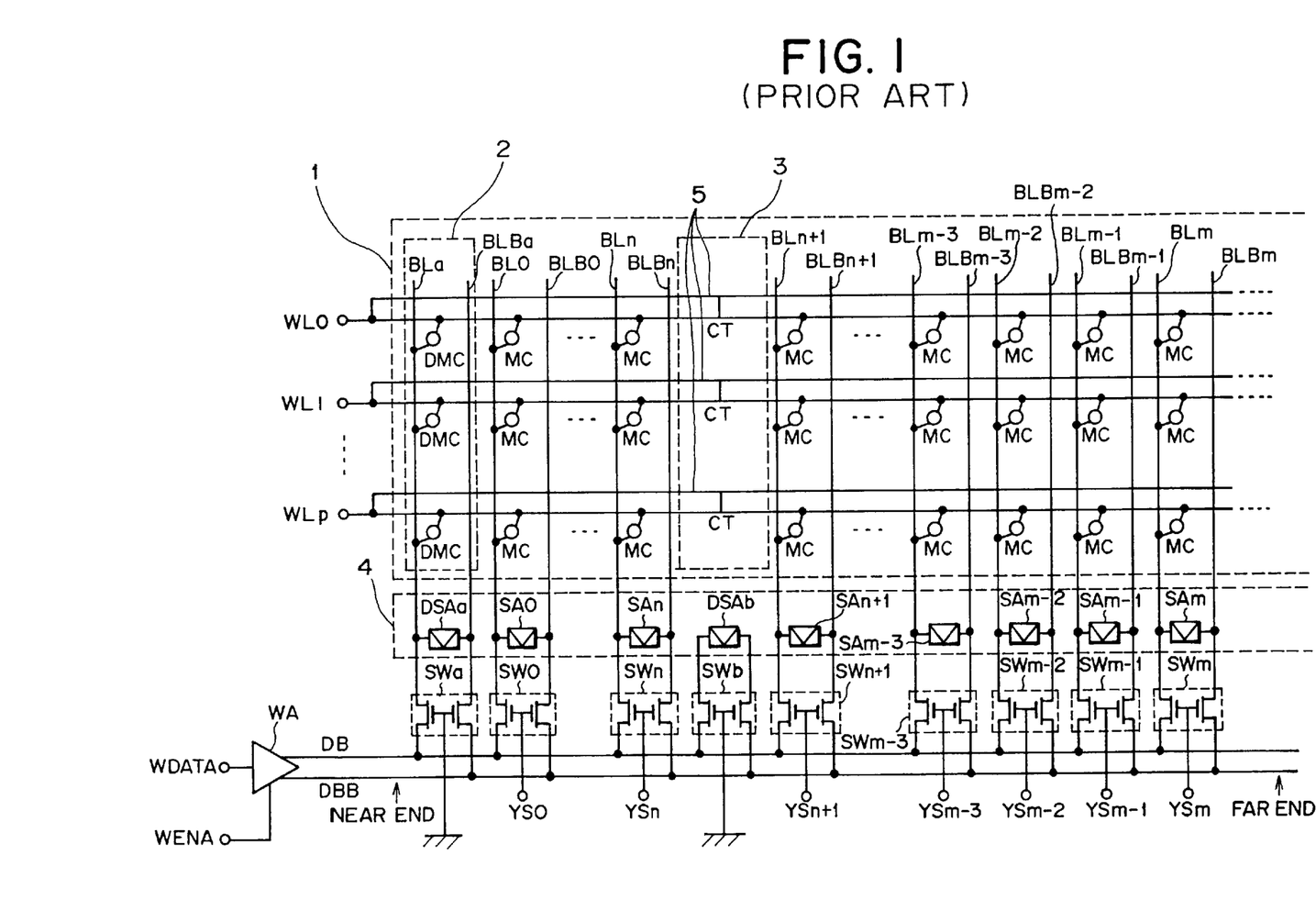
FIG. 1 is a block view illustrating a semiconductor memory device and a layout structure thereof as prior art.

FIG. 1 is a block view illustrating a layout structure of a semiconductor memory device as prior art. As shown in FIG. 1, the memory device has a memory cell array area 1 having a great number of memory cells MC arranged in a matrix form. The end portion of the memory cell array area 1 has a dummy cell area 2, in which memory cells DMC having a purpose different from the purpose that actual information is stored are arranged. The memory cells DMC are memory cells having the same shape as internal memory cells MC which are arranged outside the memory cells for storing information and have a purpose different from that of a functional operation, these internal cells being arranged for measuring a specific nature of a finished layout or electric performance of the memory cells which is caused by existence of a one-side pattern. Word lines WL0–WLp which show line addresses are gate wirings of transistors (not shown) which constitute the memory cells MC. As a material thereof, polysilicone is used. In order to restrain delay in the words lines WL0–WLp, wirings 5 made of a low resistance metal such aluminum or tungsten run in parallel to and over the word lines WL0–WLp. The wirings 5 and the word lines are connected to each other at regular intervals by means of liners (CT). For this purpose, the memory cell array area 1 has word line-suspending sections 3 for the connection by the lines. At the portions of a sense amplifier area 4 which correspond to the dummy cell area 2 and the word line-suspending sections 3, no sense amplifier is necessary from the viewpoint of operation. However, sense amplifiers DSAa, DSAb having a purpose different from functional operation are arranged to avoid a disturbance of repetition of pattern in the same way as the dummy cell area 2 is arranged in the memory cell area 1. The word lines WL0–WLp are connected to memory cells MC necessary for operation along the line direction, and one of the word lines is selected in operation. Along the row direction, to each pair of bit lines to which memory cells are connected, i.e., each of (BL0/BLB0)–(BLm/BLBm), connected is either one of sense amplifiers SA0–SAm for detecting the potential difference between the pair of each of the bit lines (BL0/BLB0)–(BLm/BLBm), and amplifying the potential difference to a predetermined value. Each of the pairs of bit lines (BL0/BLB0)–(BLm/BLBm) has either one of separation controlling gates SW0–SWm for controlling connection with and separation from a pair of data path lines (DB/DBB). Each of the pairs of bit lines (BL0/BLB0)–(BLm/BLBm) is connected to and separated from the pair of data path lines DB/DBB by the row address signals YS0–YSm. A write amplifier WA is activated by a write controlling signal WENA so that a write data signal WDATA taken in from the outside is driven to the pair of data path lines DB/DBB, as complementary data.

In the same manner as in the internal memory cells MC, to the memory cells DMC in the dummy cell area 2, connected are the word lines WL0–WLp, and the information in the memory cells DMC which is selected through the word lines WL0–WLp is read by a pair of bit lines BLa/BLBa connected thereto. The sense amplifier DSAa is connected to the pair of bit lines BLa/BLBa. The pairs of bit lines BLa/BLBa and those of bit lines BLb/BLBb, which are inputs into and outputs from the sense amplifiers DSAa and DSAb, have a separation controlling gate SWa or SWb which is the same as the separation controlling gates SW0–SWm; however, the row address signals YS0–YSm are not inputted into the pairs of bit lines BLa/BLBa and those of bit lines BLb/BLBb. The inputs are earth-connected. Thus, the data path lines DB/DBB are separated from the pairs of bit lines BLa/BLBa and those of bit lines BLb/BLBb so that the memory cells DMC are not concerned with functional operation.

Figure 2:
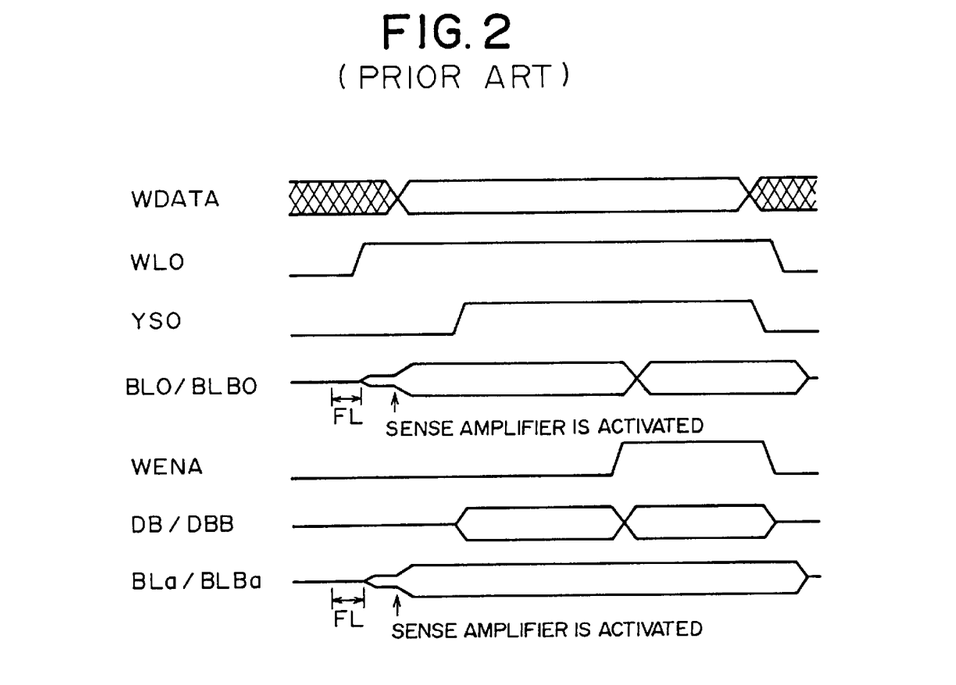
FIG. 2 is a timing chart of writing operation of the prior art semiconductor memory device and layout structure thereof.
Figure 3:
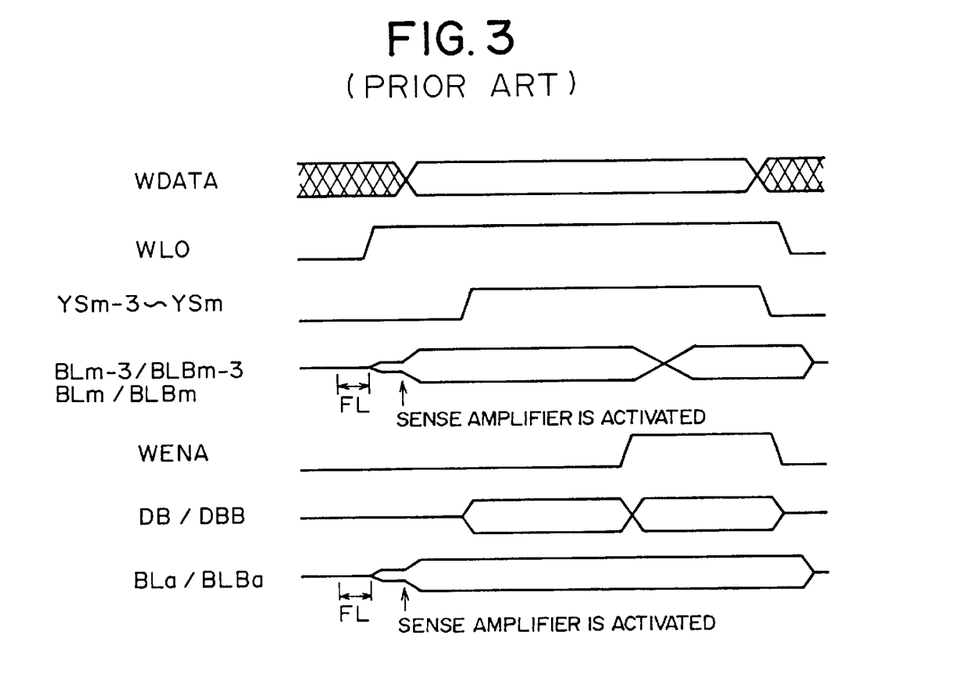
FIG. 3 is a timing chart of block writing operation of a prior art semiconductor memory device and layout structure thereof.

The following will describe operation of the semiconductor memory device as prior art, referring to FIGS. 2 and 3. FIG. 2 shows operation timing of writing, and FIG. 3 is a timing chart showing operation timing of block write.

Firstly, one of the word lines WL0–WLp is selected to be turned into a H level (it is presumed that the word line WL0 is selected). The information which the memory cell DMC and memory cells MC to which the word line WL0 is connected store is read by BLa and one-side pieces BL0–BLm of the respective pairs of bit lines to which the memory cells MC and memory cells DMC are connected, which are beforehand set to a recharge voltage HVDD and then are fallen into a floating state. The voltages of the read bit lines BL0–BLm and BLa become the potential differences between the pair of bit lines, respectively. When the sense amplifier SA0–SAm and SAa are activated, the potential differences cause the pair of bit lines (BL0/BLB0)–(BLm/BLBm) and that of bit lines BLa/BLBa to be amplified to predetermined levels.

When the write controlling signal WENA is turned into a H level, the write amplifier WA drives the write data signal WDATA into the pair of data path lines DB/DBB as complementary data. After or before this, one of row address signals YS0–YSm is selected (it is presumed that the row address signal YS0 is selected.). As a result, the row address signal YS0 is turned to a H level to select the separation controlling gate SW0. Thus, the pair of data path lines DB/DBB and the pair of bit lines BL0/BLB0 are connected to each other, and by the write amplifier WA write data are set into the sense amplifier SA0, so that the write data are written in the memory cell MC at which the word line WL0 crosses the pair of bit lines BL0/BLB0. After that, the level of the word line WL0 is dropped to finish writing operation.

The semiconductor memory device used for image processing and the like (such as VRAM, GRAM or SGRAM) may have a block write function of selecting plural row address signals YS0–YSm at the same time and carrying out writing into plural memory cells MC at the same time. During a series of the writing process, in the dummy cell area 2, DSAa is also operated in the same manner as the internal sense amplifiers SA0 and SAm so that the noise property of the sense amplifier SA0 does not have a specific nature. Specifically, the word lines WL0–WLm are also connected to the memory cells DMC, and when, for example, the word line WL0 rises correspondingly to the aforementioned operation example, the information in the memory cell DMC connected thereto is read. When the sense amplifier DSAa is activated, the potential difference between the pair of bit lines BLa/BLBa causes the pair of the bit lines BLa/BLBa to be amplified to a predetermined level. However, the input of the separation controlling gate SWa is earth-connected, and consequently the information in the pair of bit lines BLa/BLBa is not transmitted to the pair of data path lines DB/DBB nor the information in the pair of data path lines DB/DBB is not transmitted to the pair of bit lines BLa/BLBa reversibly.

The sense amplifier DSAb has a purpose for reducing property-dependency on layout, which is caused by repeated patterns having such a form that teeth fall out; therefore, in the sense amplifier DSAb, only the pattern of the sense amplifier is generally arranged. This is because an increase in area is caused if the memory cells are connected thereto and the sense amplifier is operated in the same manner as the others.

In the case where, in write operation by the aforementioned prior art, the write amplifier WA drives the pair of the data path lines DB/DBB, and then row addressee signals YS0–YSm are selected so that the data path lines DB/DBB are connected to the bit lines which are objects of writing, the wiring capacitance of the pair of data path lines DB/DBB is generally far larger than that of the selected pairs of bit lines (BL0/BLB0)–(BLm/BLBm). Therefore, the sense amplifier can be easily inverted. However, in the case where the row address signals YS0–YSm are selected before the write amplifier WA drives the pair of data path lines DB/DBB, the pair of data path lines DB/DBB is being driven by the corresponding sense amplifiers SA0–SAm connected to the selected pairs of the bit lines (BL0/BLB0)–(BLm/BLBm). The write amplifier WA must invert the corresponding sense amplifiers SA0–SAm by only the ability of the write amplifier WA itself.

The example of 4 column-block write operation will be described below, referring to the block view of FIG. 1 and the operation timing view of FIG. 3. When row address signals YSm-3, YSm-2, YSm-1 and YSm for the 4 columns are firstly selected, the pair of data path lines DB/DBB is being driven by the 4 sense amplifiers SAm-3, SAm-2, SAm-1 and SAm. In the case where the information from the sense amplifiers SAm-3, SAm-2, SAm-1 and SAm is wholly the same and the write data are inverse data of the information, the 4 sense amplifiers SAm-3, SAm-2, SAm-1 and SAm must be inverted by the ability of the write amplifier WA itself.

At that time, the ability to invert the sense amplifiers SAm-3, SAm-2, SAm-1 and SAm by the write amplifier WA becomes lower because the wiring resistance of the pair of data path lines DB/DBB is higher, as the memory cells MC which are object of writing are more distant from the write amplifier. Thus, rewriting speed becomes slower and operation at low voltage becomes worse.

In recent years, the material for wiring has been changed from aluminum to tungsten because of easiness of minute processing, and consequently wiring resistivity has been about 3 times as high as prior art. Furthermore, the capacity of a memory has become larger to increase the number of memory cells into which writing is carried out at a time by block write function.

In the light of the above, in order to carry out high speed writing, it is essential to make the size of the transistor constituting the write amplifier WA larger or to divide the write amplifier WA and shorten the wiring of the pair of data path lines DB/DBB so as to reduce wiring load. This results in obstructing high integration.

SUMMARY OF THE INVENTION

Therefore, an object of the present invention is to provide a semiconductor memory device making writing speed higher and voltage to be used lower without making the size of a write amplifier large.

In order to accomplish the object, the semiconductor memory device according to the present invention comprises:

memory cells which can store data and which are arranged in a matrix form; at least one pair of bit lines connected to the memory cells; word lines for taking out data from the memory cells into the pair of bit lines; a sense amplifier which is fitted to every pair of the bit lines so as to detect potential difference therebetween and amplifying it to a predetermined level; a write amplifier into which write data from outside are inputted and which drives a complementary pair of data path lines; an inputting circuit for providing the pair of data path lines to each of the pairs of data lines; and at least one amplifying means for detecting potential difference between the pair of data path lines and amplifying it to a predetermined level only when the write amplifier drives the pair of data path lines.

It is preferred that the amplifying means has a layout structure using the sense amplifier fitted to the pair of bit lines connected to the memory cells for processing in the end portion of an area for the memory cells.

It is preferred that the amplifying means has a layout structure using the sense amplifier fitted to a sense amplifier area which corresponds to a section where the word lines in the area for the memory cells and a low resistance material are connected to each other by a liner for restraining delay in the word lines.

It is preferred that the row addresses are assigned to the word lines.

It is preferred that a material of the word lines is made of polysilicon.

It is preferred that a wiring of a low resistance metal including aluminum or tungsten runs over the word lines and in parallel to the word lines and the word lines and the metal wiring are connected to each other at intervals by means of liners.

The semiconductor memory device according to the present invention in particular comprises: memory cells which can store data and which is arranged in a matrix form; at least one pair of bit lines connected to the memory cells; word lines for taking out data from the memory cells into the pair of bit lines; a sense amplifier which is fitted to every pair of the bit lines so as to detect potential difference therebetween and amplifying it to a predetermined level; a write amplifier into which write data from outside are inputted and which drives a complementary pair of data path lines; an inputting means for providing the pair of data path lines to each of the pairs of data lines; and at least one amplifying means for detecting potential difference between the pair of data path lines and amplifying it to a predetermined level only when the write amplifier drives the pair of data path lines.

This amplifying means has a layout structure using a sense amplifier fitted to bit lines connected to memory cells which are not for writing/reading and are within a dummy cell area in the end portion of a memory cell array area, or a sense amplifier fitted into a sense amplifier area corresponding to the section for bringing the word lines into contact with a low resistance material by liners.

According to the present invention, it is possible to reduce effect of wiring resistance and carry out writing at a high speed by using the sense amplifier corresponding to the area for memory cells which are not objects to be read, or the area where the word lines and low resistance material are connected to each other by liners. This is because the pair of data path lines is driven in the middle of the data path lines.

Furthermore, the advantage that high integration is not obstructed can be obtained because of using the area and elements which are not ones for functional operation but are ones for improving layout-property.

DESCRIPTION OF THE PREFERRED EMBODIMENTS

The following will describe preferred embodiments according to the present invention, referring to the attached drawings.

Figure 4:
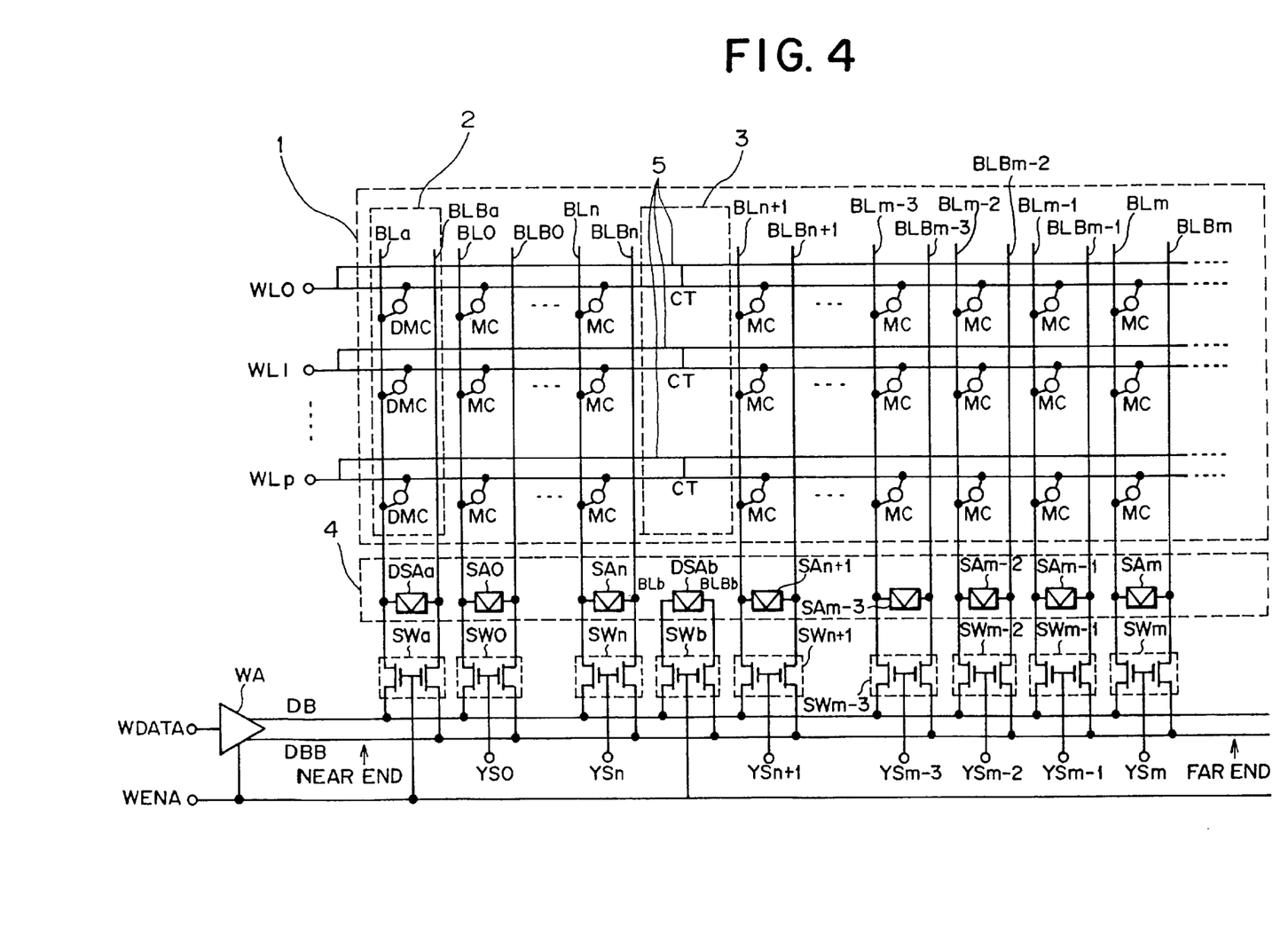
FIG. 4 is a block view illustrating an embodiment according to the present invention.

FIG. 4 is a block view illustrating a structure of the first embodiment according to the present invention. The present embodiment has a memory cell array area 1 having a great number of memory cells MC arranged in a matrix form. The end portion of the memory cell array area 1 has a dummy cell area 2, in which memory cells DMC having a purpose different from the purpose that actual information is stored are arranged. The memory cells DMC are memory cells having the same shape as internal memory cells MC which are arranged outside the memory cells for storing information and have a purpose different from the purpose of functional operation, these internal cells being arranged for measures to specific nature of a finished layout or electric performance of the memory cells which is caused by existence of a one-side pattern.

Word lines WL0–WLp which show line addresses are gate wirings of transistors (not shown) which constitute the memory cells MC. As a material thereof, polysilicon is used. In order to restrain delay in the words lines WL0–WLp, wirings 5 made of a low resistance metal such as aluminum or tungsten run in parallel to and over the word lines WL0–WLp. The wirings 5 and the word lines are connected to each other at regular intervals by means of liners (CT). For this purpose, the memory cell array area 1 has word line-suspending sections 3. At the portions of a sense amplifier area 4 which correspond to the dummy cell area 2 and the word line-suspending sections 3, no sense amplifier is necessary from the viewpoint of operation. However, in the same way as in the memory cells MC, sense amplifiers DSAa and DSAb having a purpose different from functional operation are arranged to avoid a form such that teeth fall out and which is based on repeated patterns. The word lines WL0–WLp are connected to memory cells MC necessary for operation along the line direction, and one of the word lines is selected in operation. Along the row direction, to each pair of bit lines to which memory cells are connected, i.e., each of (BL0/BLB0)–(BLm/BLBm), connected is either one of sense amplifiers SA0–SAm for detecting the potential difference between the pair of the bit lines (BL0/BLB0)–(BLm/BLBm), respectively, and amplifying the potential difference to a predetermined value. Each of the pairs of the bit lines (BL0/BLB0)–(BLm/BLBm) has either one of separation controlling gates SW0–SWm for controlling connection with and separation from a pair of data path lines DB/DBB. Each of the pairs of bit lines (BL0/BLB0)–(BLm/BLBm) is connected to and separated from the pair of data path lines DB/DBB by the row address signals YS0–YSm. A write amplifier WA is activated by a write controlling signal WENA so that a write data signal WDATA taken in from the outside is driven to the pair of data path lines DB/DBB, as complementary data. In the same manner as in the internal memory cells MC, to the memory cells DMC in the dummy cell area 2, connected are the word lines WL0–WLm, and the information in the memory cells DMC which is selected through the word lines WL0–WLp is read by a pair of bit lines BLa/BLBa connected thereto. The sense amplifier DSAa is connected to the pair of bit lines Bla/BLBa. The pairs of bit lines BLa/BLBa and those of bit lines BLb/BLBb, which are inputs in and outputs from the sense amplifiers DSAa and DSAb, have a separation controlling gate SWa or SWb which is the same as the separation controlling gates SW0–SWm; however, the row address signals YS0–YSm are not inputted to the pairs of bit lines BLa/BLBa and those of bit lines BLb/BLBb. However, to them the row address signals YS0–YSm are not inputted but the write controlling signal WENA is inputted. Thus, the pair of data path lines DB/DBB is connected to the pairs of bit lines BLa/BLBa and those of bit lines BLb/BLBb, only when the write amplifier WA is activated.

Figure 5:
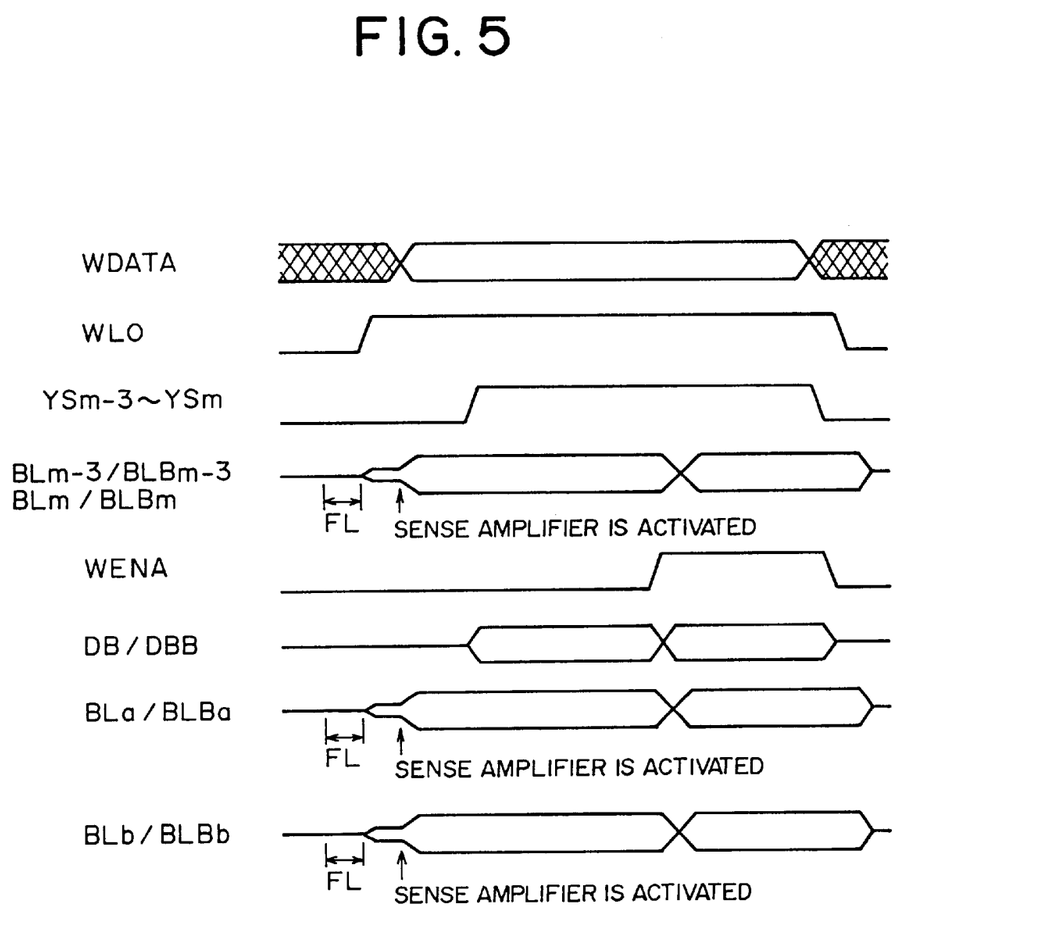
FIG. 5 is a timing chart of writing operation of the embodiment according to the present invention.

FIG. 5 shows operation timing of the embodiment according to the invention. In the operation, firstly, one of the word lines WL0–WLp is selected to be turned into a H level (it is presumed that the word line WL0 is selected). The information which the memory cell DMC and memory cells MC to which the word line WL0 is connected store is read by the pairs of bit lines (BL0/BLB0)–(BLm/BLBm) and BLa/BLBa to which the memory cells MC and memory cells DMC are connected respectively, which are beforehand set to a precharge voltage HVDD and then are fallen into a floating state. After that, the sense amplifiers SA0–SAm and SAa and SAb are activated, the pairs of bit lines (BL0/BLB0)–BLn/BLBn) are amplified to predetermined levels. At that time, the pair of the BLb/BLBb falls in a floating state, since they have no information from the memory cells. Subsequently, one of the row address signals YS0–YSm, or several signals (in the case of block writing) are turned into a H level so that input is carried out. The example of 4 column-block write operation will be described below. When row address signals YSm-3, YSm-2, YSm-1 and YSm for the 4 columns are firstly selected, the pairs of bit lines (BLm-3/BLBm-3)–(BLm/BLBm) and the pair of data path lines (DB/DBB) are connected to each other by the separation controlling gates SWm-3, SWm-2, SWm-1 and SWm, and consequently the pair of data path lines DB/DBB is being driven by 4 sense amplifiers SAm-3, SAm-2, SAm-1 and SAm. After that, the write controlling signal WENA is turned into a H level and then the write amplifier WA drives the write data signal WDATA, which is beforehand set from the outside, into the pair of the data path lines DB/DBB as a complementary value. At the same time, the sense amplifiers SAa and SAb are connected to the pair of data path lines DB/DBB by the Swa and SWb. By the write amplifier WA, write data are firstly set into the sense amplifier DSAa, which is fewer in delay time in driving the pair of data path lines DB/DBB than wiring resistance, and is near the write amplifier WA which is small in its ability-loss caused by the ON/ON states of the write amplifier WA and the sense amplifiers SAm-3–SAm. By this, the sense amplifier DSAa also drives the pair of the data path lines DB/DBB, in the same manner as the write amplifier WA. Similarly, in the order based on time constants, write data are set into the sense amplifiers SA0 and SAm, or the sense amplifiers DSAa–DSAb by the write amplifier WA. Therefore, in the case where the pair of bit lines BLb/BLBb corresponding to the word line-suspending section, as compared with the pairs of bit lines (BLm-3/BLBm-3)–(BLm/BLBm) for 4 columns which are objects of block writing, is closer to the write amplifier WA (i.e., the arrangement as illustrated in the Fig.), the write data are set into the sense amplifier DSAb, and the sense amplifier DSAb, as well as the sense amplifier DSAa drives the pair of data path lines DB/DBB. By the pair of data path lines DB/DBB, write data are set into the sense amplifiers SAm-3–SAm connected to the pairs of bit lines (BLm-3/BLB-3)–(BLm/BLBm) which are objects of block writing, so that the write data are written into the memory cells connected to the pairs of bit lines (BLm-3/BLBm-3)–(BLm/BLBm) by the word line WL0. After that, the word line WL0 is turned down into a L level to finish the writing operation.

Figure 6:
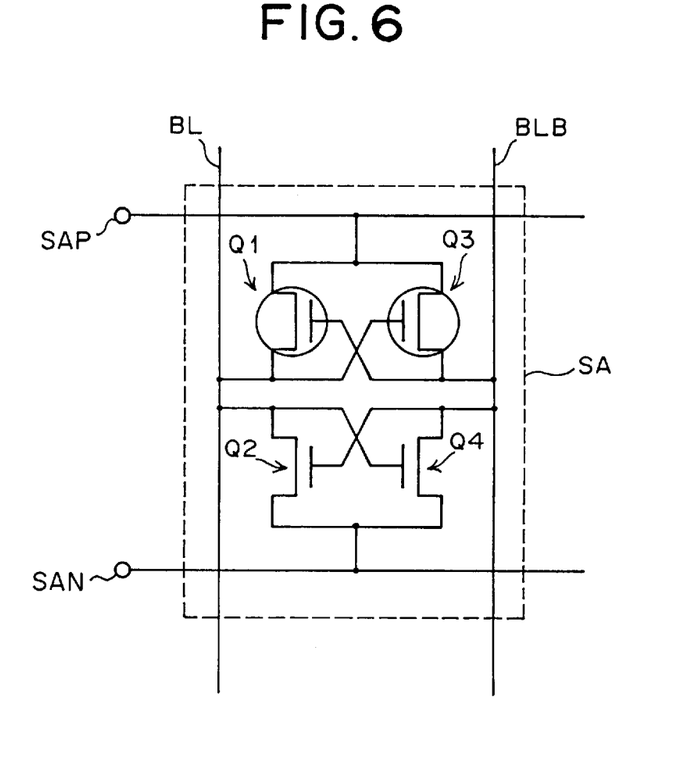
FIG. 6 is a circuit diagram showing the main section of the embodiment according to the present invention.

FIG. 6 is a circuit diagram shows the main section of the embodiment according to the present invention. Each of the sense amplifiers SA0–SAm, and DSAa and DSAb comprises PMOS transistors Q1 and Q3, and nMOS transistors Q2 and Q4, as one example of these amplifiers is shown in FIG. 6. Hereinafter, these amplifiers may be representatively referred to as a sense amplifier SA for convenience in explanation. The source electrodes (or the drain electrodes) of the pMOS transistors Q1 and Q3 are connected to a sense amplifier activating signal SAP, and the drain electrodes (or the source electrodes) thereof are connected to one line of the pair of bit lines BL/BLB, respectively. The gate electrodes thereof are connected to the other line of the pair of bit lines BL/BLB connected to the drain (source) electrodes. The source electrodes (the drains electrodes) of the nMOS transistors Q2 and Q4 are connected to a sense amplifier activating signal SAN, and the drain electrodes (or the source electrodes) thereof are connected to one line of the pair of bit lines BL/BLB, respectively. The gate electrodes thereof are connected to the other line of the pair of bit lines BL/BLB connected to the drain (source) electrodes.

Figure 7:
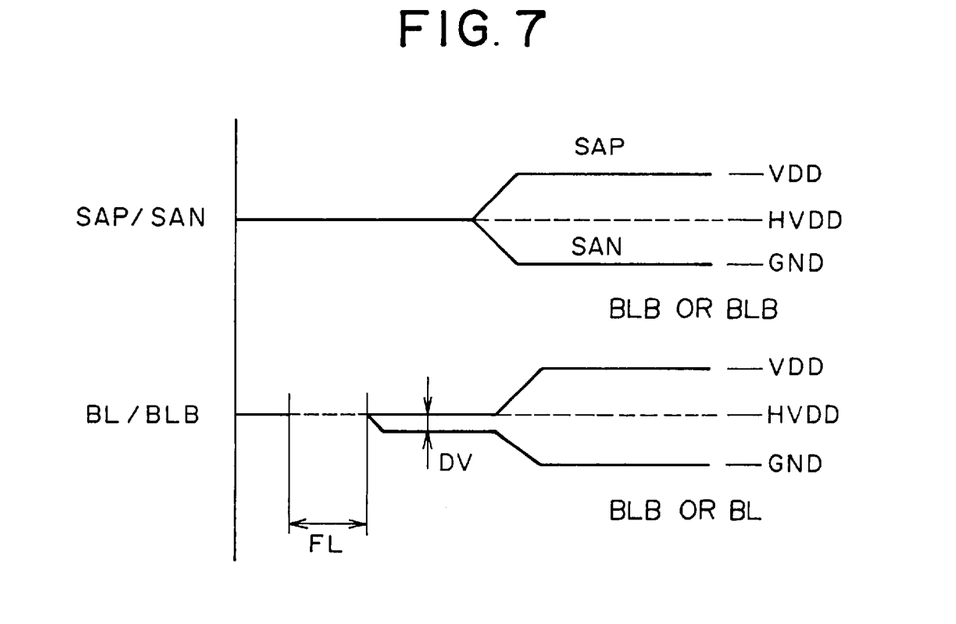
FIG. 7 is a timing chart of operation of the main section of the embodiment according to the present invention.

FIG. 7 is a timing chart showing operation of the main section of the embodiment according to the invention. This FIG. 7 shows in particular operation timing of the sense amplifier. The initial values of the sense amplifier activating signals SAP and SAN are set to a precharge voltage HVDD, respectively. The initial value of the pair of bit lines BL/BLB is also set to a power voltage VDD. After that, the pair of bit lines BL/BLB falls into a floating state, and immediately the information in the memory cell MC (not shown) connected to the pair of bit lines BL/BLB is read so that the potential difference DV is generated at the pair of bit lines BL/BLB. Subsequently, the sense amplifier activating signal SAP is turned into a power voltage VDD and the sense amplifier activating signal SAN is turned to the earthing voltage GND, so that the sense amplifier SA is activated. As a result, the voltage at the pair of the bit lines BL/BLB is amplified to the power voltage VDD or the earthing voltage GND.

What is claimed is:

1. A semiconductor memory device comprising:
   memory cells which can store data and which are arranged in a matrix form;
   at least one pair of bit lines connected to the memory cells;
   word lines for taking out data from the memory cells into the pair of bit lines;
   a sense amplifier which is fitted to every pair of the bit lines so as to detect a potential difference therebetween and amplifying said potential difference to a predetermined level;
   a write amplifier, coupled to a write control signal line, for receiving write data inputted externally therefrom and which drives a complementary pair of data path lines based on an input from the write control signal line;
   an inputting circuit for connecting said pair of data path lines to each pair of bit lines;
   at least one amplifying circuit for detecting a potential difference between said pair of data path lines and amplifying said potential difference to a predetermined level only when said write amplifier drives said pair of data path lines,
   wherein said inputting circuit includes a control gate connected to said write control signal line.

2. The semiconductor memory device according to claim 1, wherein the amplifying circuit has a layout structure using the sense amplifier fitted to the pair of bit lines connected to the memory cells for processing in the end portion of an area for the memory cells.

3. The semiconductor memory device according to claim 1, wherein the amplifying circuit has a layout structure using the sense amplifier fitted to a sense amplifier area which corresponds to a section where the word lines in the area for the memory cells and a low resistance material are connected to each other by a liner for restraining delay in the word lines.

4. The semiconductor memory device according to claim 1, wherein the row addresses are assigned to word lines.

5. The semiconductor memory device according to claim 1, wherein the word lines is made of polysilicone.

6. The semiconductor memory device according to claim 1, wherein a wiring of a low resistance metal including aluminum or tungsten runs over the word lines and in parallel to the word lines and the word lines and the metal wiring are connected to each other at intervals by means of liners.

7. A semiconductor memory device claimed in claim 1, wherein said at least one amplifying circuit comprises a dummy sense amplifier coupled to first and second bit lines of said pair of bit lines, and
   wherein said dummy sense amplifier drives said pair of data path lines in an intermediate portion thereof.

8. A semiconductor memory device claimed in claim 7, wherein said first and second bit lines have said control gate therebetween.

9. A semiconductor memory device claimed in claim 7, wherein said data path lines are further driven by said sense amplifier selected by an address signal connected by said control gate.

10. A semiconductor memory device claimed in claim 1, wherein each pair of said at least one pair of bit lines have exclusive use of said control gate for controlling connection with said pair of data path lines.

11. A semiconductor memory device claimed in claim 10, wherein each pair of said at least one pair of bit lines read information, located in said internal memory cells within a dummy cell area, selected through said word lines connected to said memory cells.

12. A semiconductor memory device claimed in claim 1, wherein said control gate is positioned between first and second bit lines of said at least one pair of bit lines, said first and second bit lines being coupled to said at least one amplifying circuit.

13. A semiconductor memory device claimed in claim 1, wherein said pair of bit lines connected to said at least one amplifying circuit selectively receive a write control signal from said write control signal line.

14. A semiconductor memory device claimed in claim 1, wherein said data path lines are connected to said bit lines, only when the write amplifier is activated.

15. A semiconductor memory device claimed in claim 1, wherein said at least one amplifying circuit selectively drives said data path lines in an intermediate portion thereof.

16. A memory device comprising:

a plurality of bit lines;

a dummy sense amplifier coupled to first and second bit lines of said plurality of bit lines;

an input circuit including a gate coupled between portions of said first and second bit lines of said plurality of bit lines; and a write control signal line, coupled to said first and second bit lines, for selectively allowing said dummy sense amplifier to drive the bit lines.

17. A memory device claimed in claim 16, wherein said dummy sense amplifier selectively drives, in an intermediate portion, a pair of data path lines coupled to said first and second bit lines.

18. A memory device comprising:

a plurality of memory cells;

at least one pair of bit lines connected to the memory cells;

word lines for taking out data from the memory cells into the pair of bit lines;

a write amplifier, coupled to a write control signal line, for receiving write data inputted externally therefrom and which drives a complementary pair of data path lines based on an input from the write control signal line;

an inputting circuit for connecting the pair of data path lines to each of the pair of bit lines; and at least one amplifying circuit for detecting a potential difference between the pair of data path lines and amplifying said potential difference to a predetermined level only when the write amplifier drives the pair of data path lines, and wherein said inputting circuit includes a control gate connected to said write control signal line.

19. A memory device claimed in claim 18, further comprising a sense amplifier fitted to said bit lines so as to detect a potential difference therebetween and amplifying said potential difference to a predetermined level, wherein a portion of said memory cells are within a dummy cell area of a memory cell array and said pair of bit lines have said control gate connected to said pair of data path lines.

20. A memory device claimed in claim 18, further comprising a sense amplifier fitted to every pair of said bit lines so as to detect a potential difference therebetween and amplifying said potential difference to a predetermined level.

* * * * *